United States Patent
Madrid (10) Patent No.: US 7,821,116 B2
(45) Date of Patent: Oct. 26, 2010

(54) SEMICONDUCTOR DIE PACKAGE INCLUDING LEADFRAME WITH DIE ATTACH PAD WITH FOLDED EDGE

(75) Inventor: Ruben Madrid, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 142 days.

(21) Appl. No.: 11/671,065

(22) Filed: Feb. 5, 2007

(65) Prior Publication Data

US 2008/0185696 A1     Aug. 7, 2008

(51) Int. Cl.
*H01L 23/495*  (2006.01)
*H01L 23/48*   (2006.01)

(52) U.S. Cl. .................. 257/676; 257/666; 257/692

(58) Field of Classification Search ............ 257/666, 257/672, 675, 676, 692, 693, 698, E23.037, 257/E23.046, E23.047, E23.048
See application file for complete search history.

(56) References Cited

U.S. PATENT DOCUMENTS

| | | |
|---|---|---|
| 4,751,199 A | 6/1988 | Phy |
| 4,772,935 A | 9/1988 | Lawler et al. |
| 4,788,583 A | 11/1988 | Kawahara et al. |
| 4,791,473 A | 12/1988 | Phy |
| 4,796,080 A | 1/1989 | Phy |
| 4,839,713 A | 6/1989 | Teraoka et al. |
| 4,839,717 A | 6/1989 | Phy et al. |
| 4,890,153 A | 12/1989 | Wu |
| 5,053,357 A | 10/1991 | Lin et al. |
| 5,157,480 A | 10/1992 | McShane et al. |
| 5,227,662 A | 7/1993 | Ohno et al. |
| 5,327,325 A | 7/1994 | Nicewarner, Jr. |
| 5,365,106 A | 11/1994 | Watanabe |
| 5,578,871 A | 11/1996 | Fierkens |
| 5,594,234 A | 1/1997 | Carter, Jr. et al. |
| 5,646,446 A | 7/1997 | Nicewarner, Jr. et al. |
| 5,776,797 A | 7/1998 | Nicewarner, Jr. et al. |
| 6,133,634 A | 10/2000 | Joshi |
| 6,329,706 B1 | 12/2001 | Nam |
| 6,424,035 B1 | 7/2002 | Sapp et al. |
| 6,432,750 B2 | 8/2002 | Jeon et al. |
| 6,449,174 B1 | 9/2002 | Elbanhawy |
| 6,489,678 B1 | 12/2002 | Joshi |
| 6,556,750 B2 | 4/2003 | Constantino et al. |
| 6,566,749 B1 | 5/2003 | Joshi et al. |

(Continued)

FOREIGN PATENT DOCUMENTS

JP       55-72065 A       5/1980

(Continued)

*Primary Examiner*—Hung Vu
(74) *Attorney, Agent, or Firm*—Townsend and Townsend and Crew LLP (57) ABSTRACT

A semiconductor die package is disclosed. The semiconductor die package comprises a leadframe structure with a die attach pad including a die attach surface, a folded edge structure and an opposite surface opposite to the die attach surface. A plurality of leads extending laterally away from the die attach pad. A semiconductor die comprising a first surface and a second surface is attached to the semiconductor die, and a molding material is around at least a portion of the leadframe structure and at least a portion of the semiconductor die. The opposite surface is exposed through the molding material and terminal ends of the leads do not extend past lateral edges of the molding material.

17 Claims, 10 Drawing Sheets

U.S. PATENT DOCUMENTS

| | | |
|---|---|---|
| 6,574,107 B2 | 6/2003 | Jeon et al. |
| 6,621,152 B2 | 9/2003 | Choi et al. |
| 6,627,991 B1 | 9/2003 | Joshi |
| 6,642,738 B2 | 11/2003 | Elbanhawy |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tanpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,030,501 B2 * | 4/2006 | Yoshiba et al. ............... 257/777 |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,495,323 B2 * | 2/2009 | St. Germain et al. ........ 257/676 |
| 2005/0046008 A1 * | 3/2005 | Gai ............................ 257/690 |

FOREIGN PATENT DOCUMENTS

| | | |
|---|---|---|
| JP | 60-15955 A | 1/1985 |
| JP | 63-36551 A | 2/1988 |
| JP | 1-108731 A | 4/1989 |
| JP | 1-128891 A | 5/1989 |
| JP | 1-225190 A | 9/1989 |
| JP | 2-294060 A | 12/1990 |
| JP | 5-29529 A | 2/1993 |
| JP | 5-218273 A | 8/1993 |
| JP | 5-304242 A | 11/1993 |
| JP | 6-29632 A | 2/1994 |
| JP | 6-61408 A | 3/1994 |
| JP | 6-120396 A | 4/1994 |
| JP | 6-163777 A | 6/1994 |
| JP | 6-169189 A | 6/1994 |
| JP | 6-196616 A | 7/1994 |
| JP | 6-204630 A | 7/1994 |
| KR | 0002091 B1 | 2/1996 |
| KR | 0125870 Y1 | 6/1998 |

* cited by examiner

SEMICONDUCTOR DIE PACKAGE INCLUDING LEADFRAME WITH DIE ATTACH PAD WITH FOLDED EDGE

CROSS-REFERENCES TO RELATED APPLICATIONS

Not Applicable

BACKGROUND

More and more portable equipment use sophisticated features such as color display, stereo audio and connectivity solutions. Some examples include: GPRS, Wireless LAN and Bluetooth along with video and camera functionality. However, consumers do not want large, bulky equipment. Instead, they demand tiny form factors and light-weight, user-friendly designs with long battery life. This consumer preference poses a dilemma for electrical design engineers. More power needs to be delivered to the system, and there is less space and battery capacity available to design the power supply for today's sophisticated portable devices. These technical requirements translate into the need for integrated circuits that offer fast and accurate battery charging, higher-power conversion efficiency, lower-power consumption, and greater functional integration while occupying less space.

Previously, a few linear regulators were sufficient to design a simple power supply. However, running a system on the lowest possible energy budget and dissipating the least amount of heat in space-constraint designs forces the use of more complex, but significantly more power-efficient, switch-mode DC/DC converters. They contribute to longer battery life and minimize board space.

New low-profile packaging technology, low-power process technology and advanced power management methodologies simplify design complexity. Compared to previous leaded packages, one cutting-edge packaging technology established in the market recently is the QFN (Quad Flat No-Lead) package.

While conventional QFN packages are acceptable, a number of improvements can be made to QFN type packages. For example, improvements could be made to locking the molding material in the package to the leadframe structure of the package, preventing moisture from passing to the die in the package, and preventing solder between a die and die attach pad from overflowing off of a die attach pad and keeping it confined to the die attach pad.

Embodiments of the invention address these and other problems individually and collectively.

BRIEF SUMMARY

Embodiments of the invention relate to semiconductor die packages, methods for making semiconductor die packages, and electrical assemblies including semiconductor die packages.

One embodiment of the invention is directed to a semiconductor die package comprising a leadframe structure comprising a die attach pad comprising a die attach surface, a folded edge structure, and an opposite surface opposite to the die attach surface. A plurality of leads extend laterally away from the die attach pad. The die package also includes a semiconductor die comprising a first surface and a second surface, wherein the first surface is attached to the die attach pad, as well as a molding material formed around at least a portion of the leadframe structure and at least a portion of the semiconductor die. The opposite surface of the leadframe structure is exposed through the molding material and terminal ends of the leads are substantially co-extensive with lateral surfaces of the molding material.

Another embodiment of the invention is directed to a method for forming a semiconductor die package. The method comprises obtaining a leadframe structure comprising a die attach pad comprising a die attach surface comprising a folded edge structure and an opposite surface opposite to the die attach surface, and a plurality of leads extending laterally away from the die attach pad. After the leadframe structure is obtained, it is attached to a semiconductor die. The semiconductor die comprises a first surface and a second surface, and the first surface is attached to the die attach pad. A molding material is formed around at least a portion of the leadframe structure and at least a portion of the semiconductor die. The opposite surface is exposed through the molding material and wherein terminal ends of the leads are substantially co-extensive with lateral surfaces of the molding material.

Another embodiment of the invention is directed to a method comprising: obtaining an array of leadframe structures, wherein the array of leadframe structures comprises quadrants of leadframe structures; clamping a central clamping area of the array of leadframe structures between quadrants; and forming a molding material around the leadframe structures in the array of leadframe structures.

Other embodiments of the invention are directed to electrical assemblies and methods for forming the same.

BRIEF DESCRIPTION OF THE DRAWINGS

In the Figures, like numerals designate like elements and the descriptions of some elements may or may not be repeated. The Figures are described in further detail below in the Detailed Description.

DETAILED DESCRIPTION

One embodiment of the invention is directed to a semiconductor die package comprising a leadframe structure comprising a die attach pad comprising a die attach surface, a folded edge structure, and an opposite surface opposite to the die attach surface. A plurality of leads extend laterally away from the die attach pad. The die package also includes a semiconductor die comprising a first surface and a second surface, wherein the first surface is attached to the die attach pad, as well as a molding material (e.g., an epoxy molding material) formed around at least a portion of the leadframe structure and at least a portion of the semiconductor die. The opposite surface of the leadframe structure is exposed through the molding material and terminal ends of the leads are substantially co-extensive with lateral surfaces of the molding material.

Preferred embodiments of the invention are directed to QFN type packages. A QFN-type package is outstanding for its small size, cost-effectiveness and good production yields. This package possesses certain mechanical advantages for high-speed and power management circuits including improved co-planarity and heat dissipation. Because QFN packages do not have gull wing leads like traditional SOIC and TSSOP packages which at times can act as antennas, creating 'noise' in high-frequency applications, their electrical performance is superior to traditional leaded packages. In addition, they provide excellent thermal performance through the exposed lead frame pad enabling a direct thermal path for removing heat from the package. The thermal pad typically is soldered directly to printed circuit board (PCB) and thermal vias in the board help dissipate excess power into a copper ground plane, making additional heat sinking unnecessary.

Figure 1:
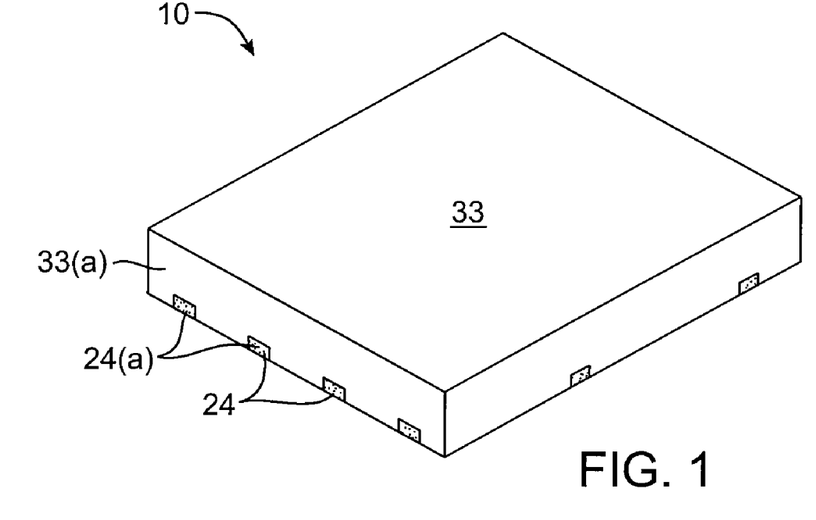
FIG. 1 is a top perspective view of a die package according to an embodiment of the invention.

FIG. 1 shows a bottom perspective view of a die package 10 according to an embodiment of the invention. The package 10 comprises a molding material 33 and terminal ends 24(a) of leads 24 that are part of a leadframe structure. As shown in FIG. 1, the terminal ends 24(a) do not extend past a lateral surface 33(a) of the molding material 33. In some cases, the end surfaces of the terminal ends 24(a) of the leads 24 are within the same plane (in this example, a vertical plane), or are substantially coplanar, with the lateral surface 33(a).

Figure 2:
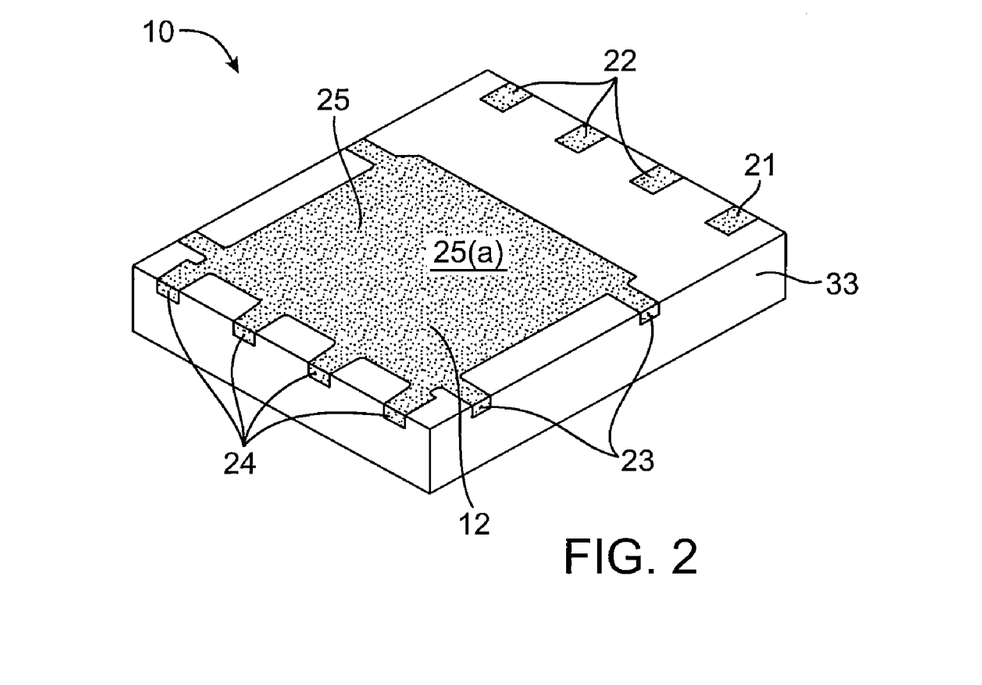
FIG. 2 is a bottom perspective view of the die package shown in FIG. 1.

FIG. 2 shows a bottom, perspective view of the die package 10 shown in FIG. 1. As shown in FIG. 2, the molding material 33 surrounds at least a portion of a leadframe structure 12, which may comprise a die attach pad 25, a gate lead 21, source leads 22, and drain leads 24. The drain leads 24 are integral with and extend laterally away from the die attach pad 25 in this example. Solid tie bars 24 are also integral with and extend laterally away from the die attach pad 25. The tie bars 24 need not be stamped or half-etched.

The leadframe structure 12 may comprise any suitable material. For example, the leadframe structure 12 may comprise any suitable conductive material. Examples of suitable materials include copper. The leadframe structure may also be unplated or plated. If is it plated, it may comprise a base metal such as copper and one or more plated layers. In preferred embodiments, the leadframe structure 12 comprises a base metal (e.g., copper), and plated metal. Plating materials may comprise various underbump metallurgy materials including nickel, chromium, palladium, etc.

As shown in FIG. 2, an exterior surface 25(a) of the leadframe structure 12 that is opposite to a die attach surface (not shown) of the die attach pad 25 is exposed and is substantially coplanar with a bottom exterior surface of the molding material 33. The exterior surface 25(a) could be directly attached (e.g., via solder) to a conductive pad on a circuit board. When it is mounted to the circuit board, the die attach pad (DAP) 25 would be very close to and directly in contact with the circuit board, thereby providing for short electrical and thermal paths between the die in the package 10 and the circuit board.

Figure 3:
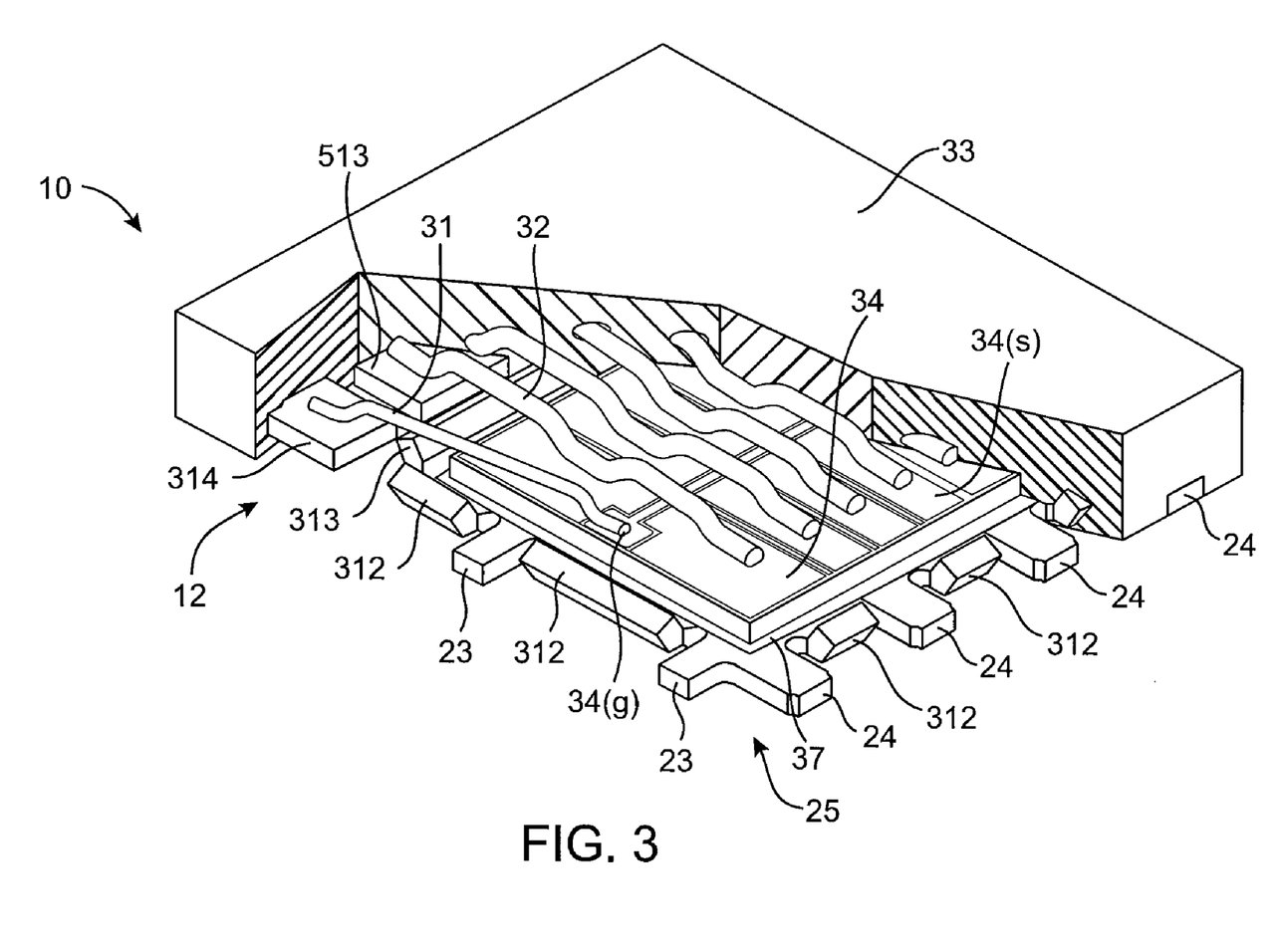
FIG. 3 is a top perspective view of the die package shown in FIG. 1 with part of the molding material cut away.

FIG. 3 shows a top perspective view of the exemplary die package 10 shown in FIGS. 1 and 2 with part of the molding material 33 removed to reveal some of the inner components of the die package 10.

The leadframe structure 12 further comprises a gate pad 314 (which in combination with one or more gate leads may define a gate lead structure), and a source pad 513 (which in combination with one or more source leads may define a source lead structure). The source pad 513 the gate pad 314 may be electrically separated from the die attach pad 25.

The leadframe structure 12 may also comprise folded structures 312, which surround the die 34 and a central portion of the die attach pad 25. The folded structures 312 are also interleaved with the drain leads 24. There may be two or more folded structures per side of the die attach pad 25, and they may be curved upward at a suitable angle (e.g., 45 to 90 degrees, or preferably from 60 to 90 degrees) toward the die 34 which is on the die attach pad 25 and relative to the orientation of the die attach pad 25. The folded structures 312 may be formed using any suitable process including stamping. If stamping is used, half-etching is not necessary to shape the leadframe structure 12. This can ultimately reduce the cost of leadframe material as well the assembly process.

The die package 10 further comprises a die 34 attached to the die attach pad 25 of the leadframe structure 12. Solder paste 37 or some other conductive adhesive could be used in embodiments of the invention to electrically and/or mechanically couple the die 34 to the die attach pad 25.

The die 34 may comprise silicon, and may further comprise a power, vertical MOSFET. In this embodiment, it may comprise a first surface comprising a drain terminal, which is attached to and is proximate to the die attach pad 25, and a second surface which is opposite to the first surface. The second surface of the die 34 comprises a gate terminal 34(g) and a source terminal 34(s).

While power MOSFETs are described in detail, any suitable vertical power transistor can be used in embodiments of the invention. Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. Other electrical devices such as vertical resistors, capacitors, etc. may also be used in embodiments of the invention.

Source wires 32 may couple source terminals 34(s) in the semiconductor die 34 to the source pad 513. Likewise, a gate wire 31 may couple a gate terminal 34(g) in the semiconductor die 34 to the gate pad 314. The wires 31, 32 may comprise any suitable material including copper, aluminum, and noble metals (e.g., gold). They may also be coated or not coated with another metallic material. In addition, as an alternative to wires, clips such as source clips and gate clips could be used in other embodiments of the invention.

In FIG. 3, the folded edge structures 312 provide a number of advantages. First, they can help control the flow of solder 37 and confine it to the die attach pad 25. It can also help to lock the molding material 33 to the leadframe structure 12.

Figure 4:
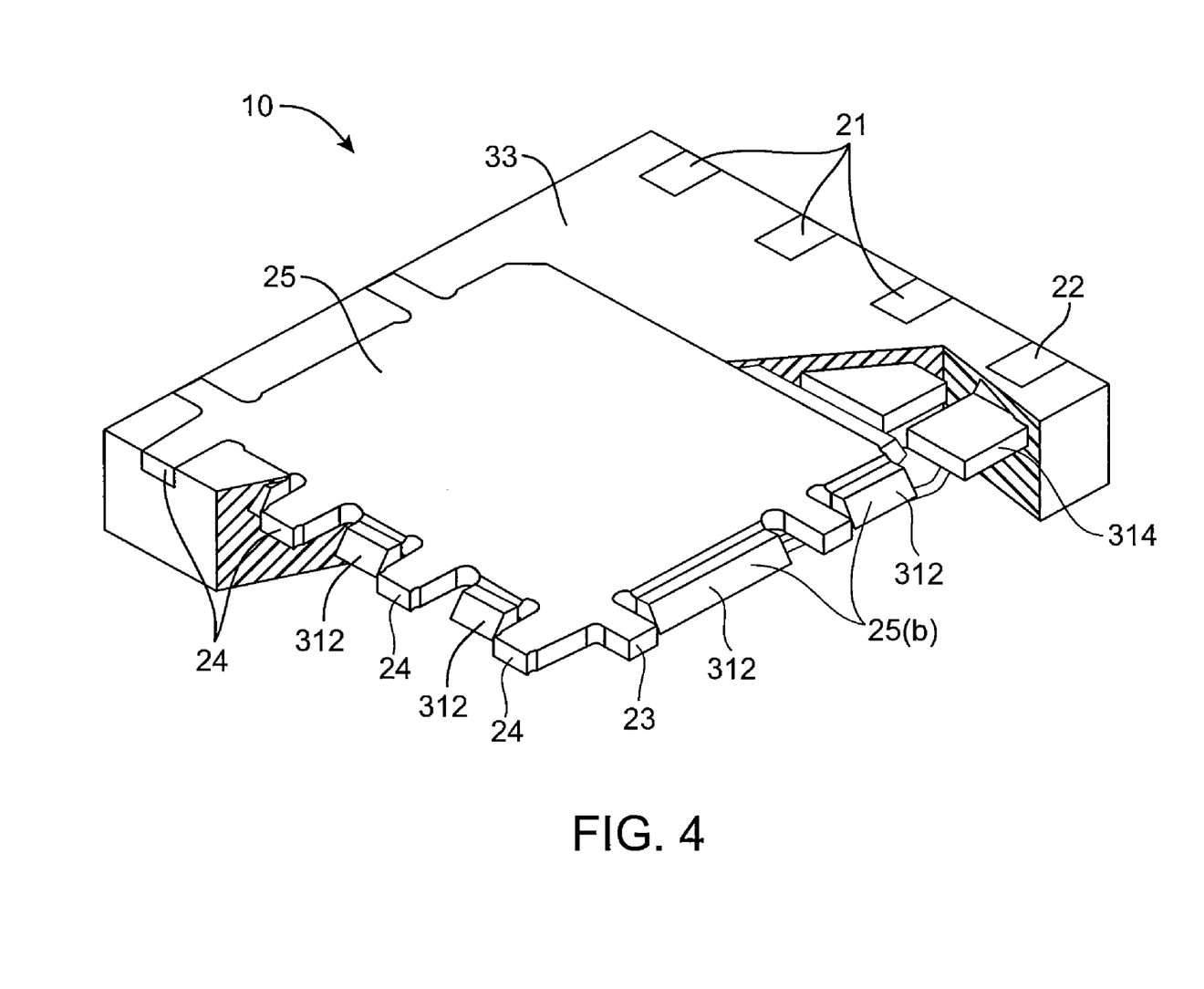
FIG. 4 is a bottom perspective view of the die package shown in FIG. 2, with part of the molding material removed.

FIG. 4 shows a bottom view of the die package 10 with part of the molding material 33 being removed. The components in FIG. 4 are described in detail above, and in further detail below. In addition, FIG. 4 shows a stamped recess 25(b) which may be from about 0.5 to about 1 mil (i.e., $\frac{1}{1000}$ inches) in height. This recess can help with lock the molding material 33 to the leadframe structure 25.

Figure 5:
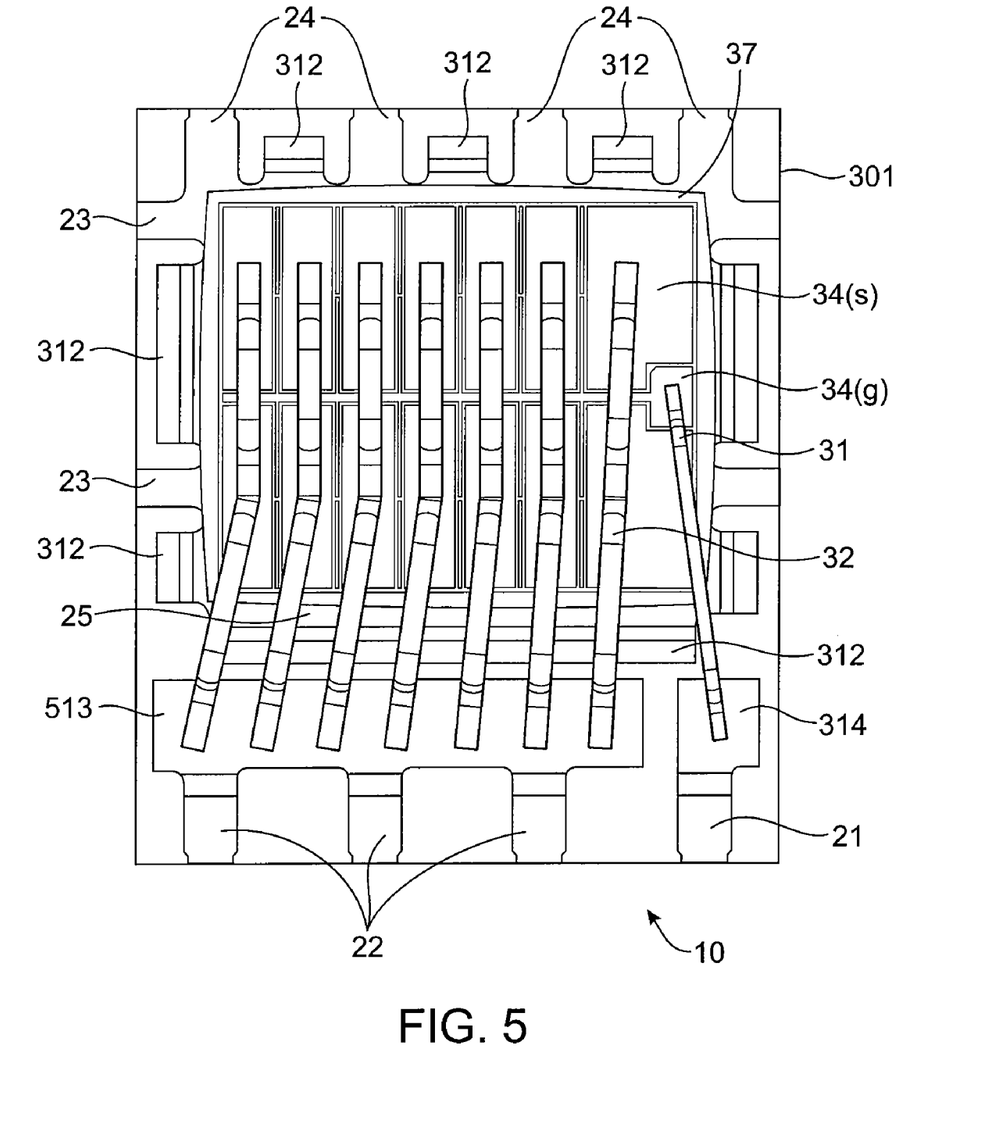
FIG. 5 is a top plan view a die package with the molding material removed.

FIG. 5 shows a plan view of the die package 10 with the molding material removed. The components in FIG. 5 are described in detail above, and in further detail below. In addition, FIG. 5 shows the outline 301 of the package 10, and FIG. 5 more clearly shows a source lead structure comprising source leads 22 integrally connected to a source pad 513. It also more clearly shows a gate lead structure comprising a gate lead 21 and an integrally connected gate pad 314.

Figure 6:
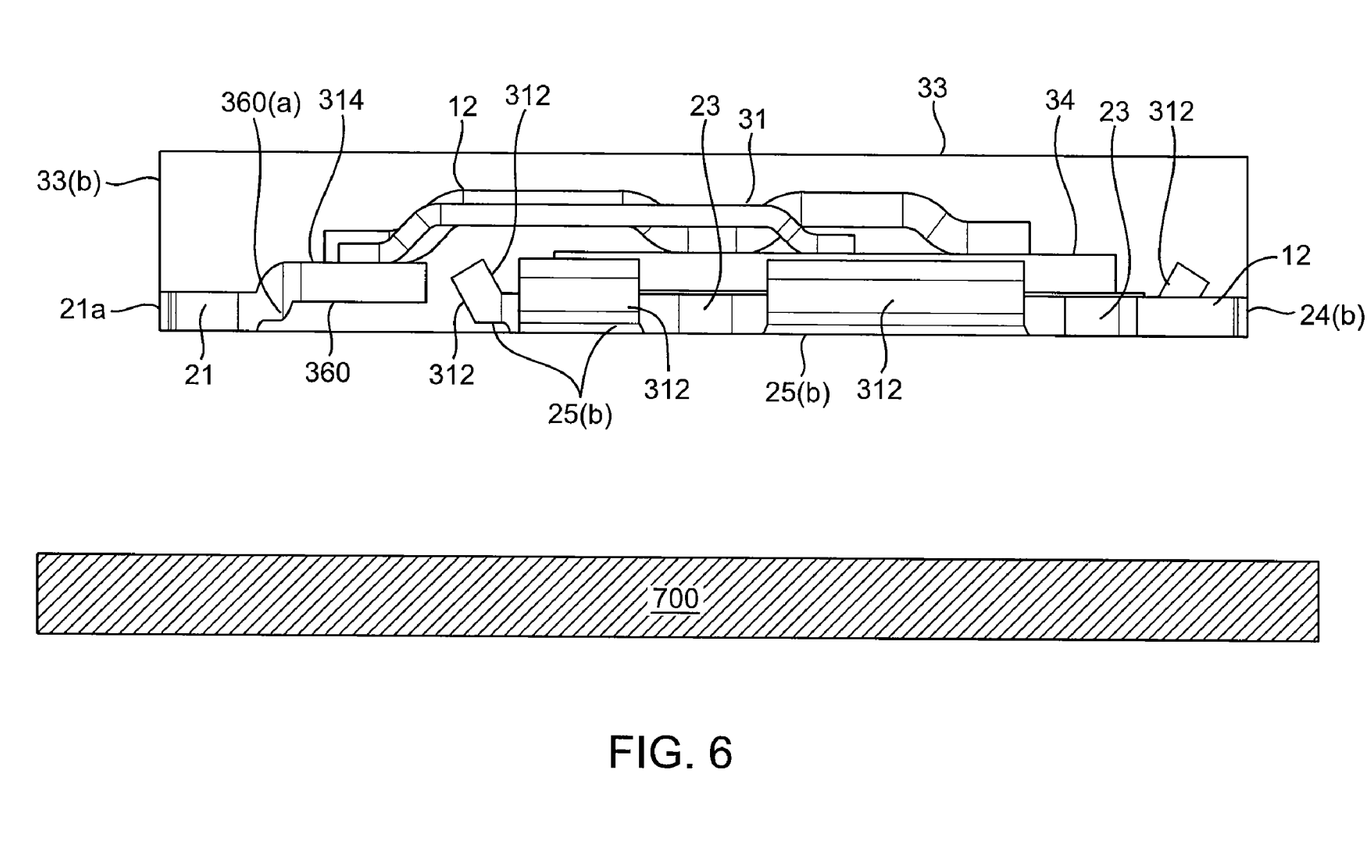
FIG. 6 is a side, cross-sectional view of a die package of the type shown in FIG. 1.

FIG. 6 shows a side, cross-sectional view of the die package 10. The components in FIG. 6 are described in detail above, and in further detail below. In addition, FIG. 6 shows a stamped recess 25(b) which may be from about 0.5 to about 1 mil (i.e., 1/1000 inches) in height (or greater than about 0.5 mil or about 1.0 mil in other embodiments). This recess can help with lock the molding material 33 to the leadframe structure 25. As shown in FIG. 6, the molding material 33 can fill the recess 25(b) to provide for better mold locking between the molding material and the leadframe structure 12.

FIG. 6 also more clearly shows a side profile of the gate lead structure 360. The gate lead structure includes a gate pad 314 and a gate lead 21 with a terminal end 21(a), and it may have a side profile that is step-shaped. The end surface of the terminal end 21(a) is substantially co-extensive with the lateral surface 33(b) of the molding material 33. Also, another recess 360(a) is also formed between the terminal end 21(a) and the gate pad 314. The molding material 33 may also fill this recess 360(a) to provide for better locking.

A schematic illustration of a circuit substrate 700 is also shown in FIG. 6. The illustrated package may be mounted on the circuit substrate 700 using solder or the like to form an electrical assembly. (Discrete insulating and conductive layers are not shown in the circuit substrate 700 in FIG. 6.)

Figure 7:
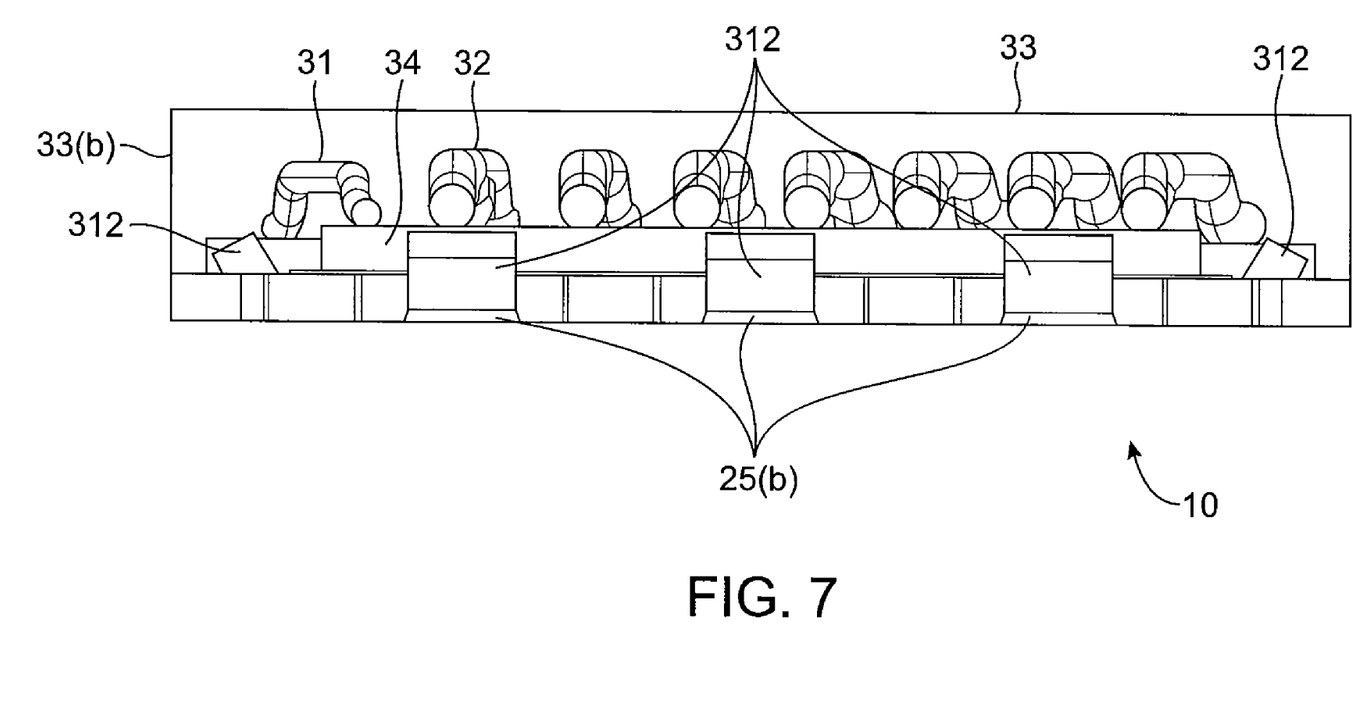
FIG. 7 shows a front, cross-sectional view of a die package of the type shown in FIG. 1.

FIG. 7 shows a front, cross-sectional view of the die package 10. The components in FIG. 7 are described in detail above, and in further detail below.

Figure 8:
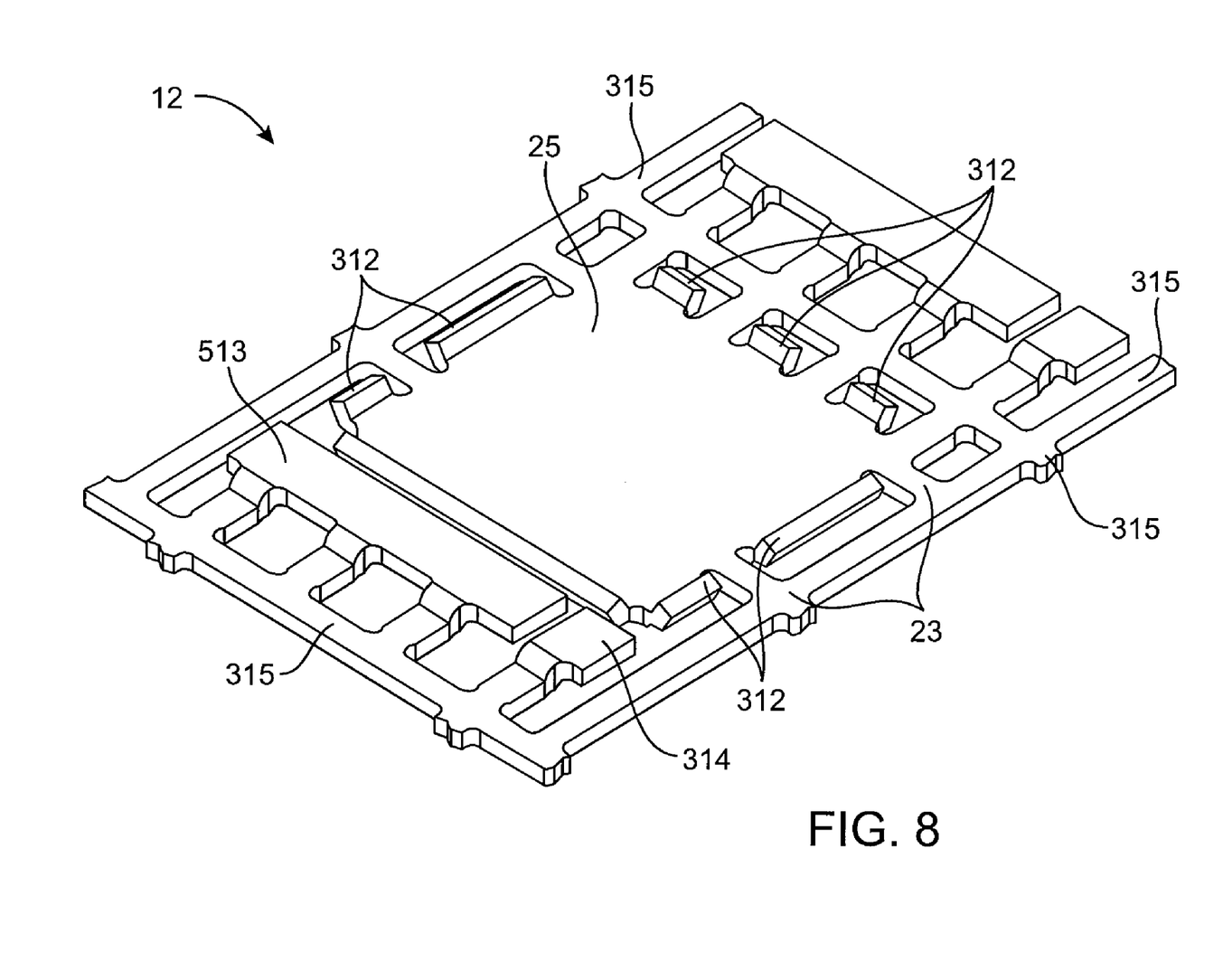
FIG. 8 is a top perspective view of a leadframe structure.

FIG. 8 shows a top perspective view of the internal leadframe structure 25. The internal leadframe structure 25 includes a number of tie bars 315 which can join the leadframe structure 25 to other leadframe structures (not shown) to form an array of leadframe structures. As shown, the folded edge structures 312 are on four sides defining the die attach pad 25, and can effectively shield a die that is mounted on the central region of the die attach pad 25. As shown, at least one lead is between adjacent folded edge structures 312 in this example. The other features in FIG. 8 are described in further detail above.

Figure 9:
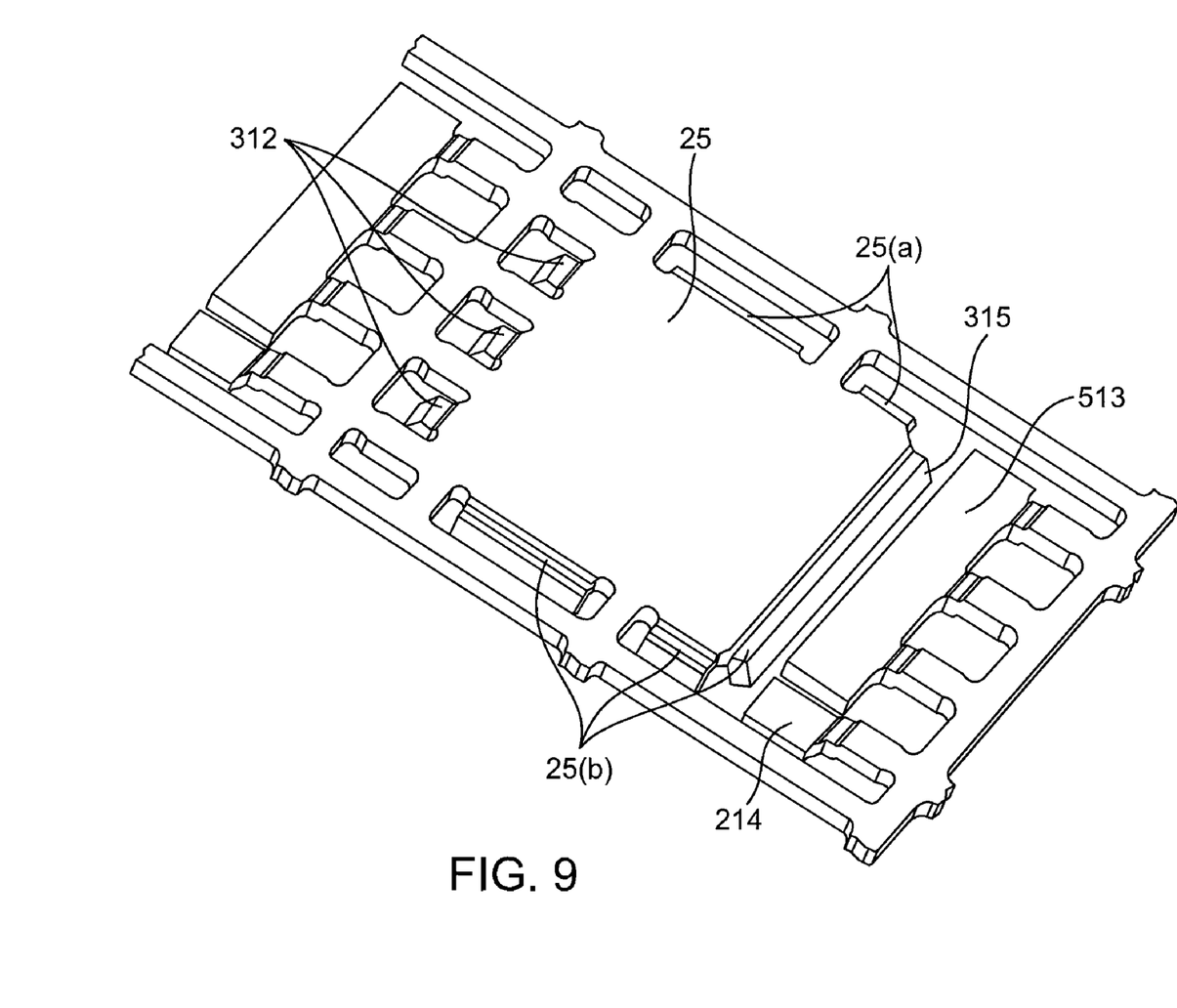
FIG. 9 is a bottom perspective view of the leadframe structure in FIG. 8.

FIG. 9 shows a bottom view of the leadframe structure 25 shown in FIG. 8. The components in FIG. 9 have been described in prior Figures and need not be repeated here.

Figure 10:
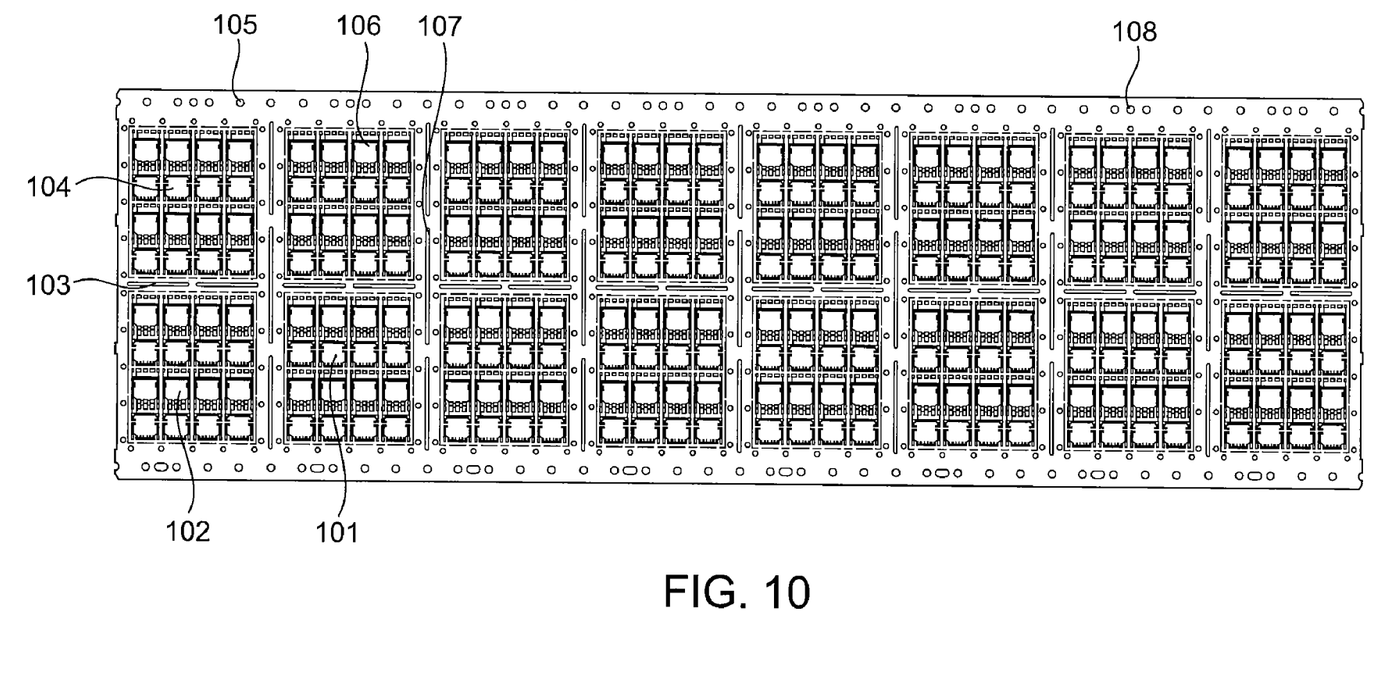
FIG. 10 is a top plan view of a leadframe layout.

FIG. 10 shows a leadframe structure layout. It shows a number of frame arrays 101, 102, 104, 106 in different quadrants. Each quadrant may have any suitable number of leadframe structures of any suitable dimensions. The leadframe structures that can be used may be those described above, or may be conventional leadframe structures. In some embodiments, there may be greater than 4, 16, 25, or even 36 leadframe structures per quadrant. An array of leadframe structures may have any suitable number of quadrants (e.g., 4, 6, 8, or more). In the specific example in FIG. 10, there may be a four quadrant pattern with 16 leadframe structures per quadrant. This makes it possible to mass produce die packages using arrays of stamped leadframe structures.

Unlike leadframe structures in used today's industry, which are present in sixty four units per panel, it is very difficult to stamp them because of very high material stress. Embodiments of the invention make the stamping of a QFN frame possible, since the 64-units are divided into four quadrants. Embodiments of the invention allow the use of a strong horizontal tie bar 103 and vertical tie bar 107. The horizontal tie bar 103 and vertical tie bar 107 will serve as clamping areas during molding. The tie bars 103, 107 will help to eliminate warping and mold bleeding during molding.

Figure 11:
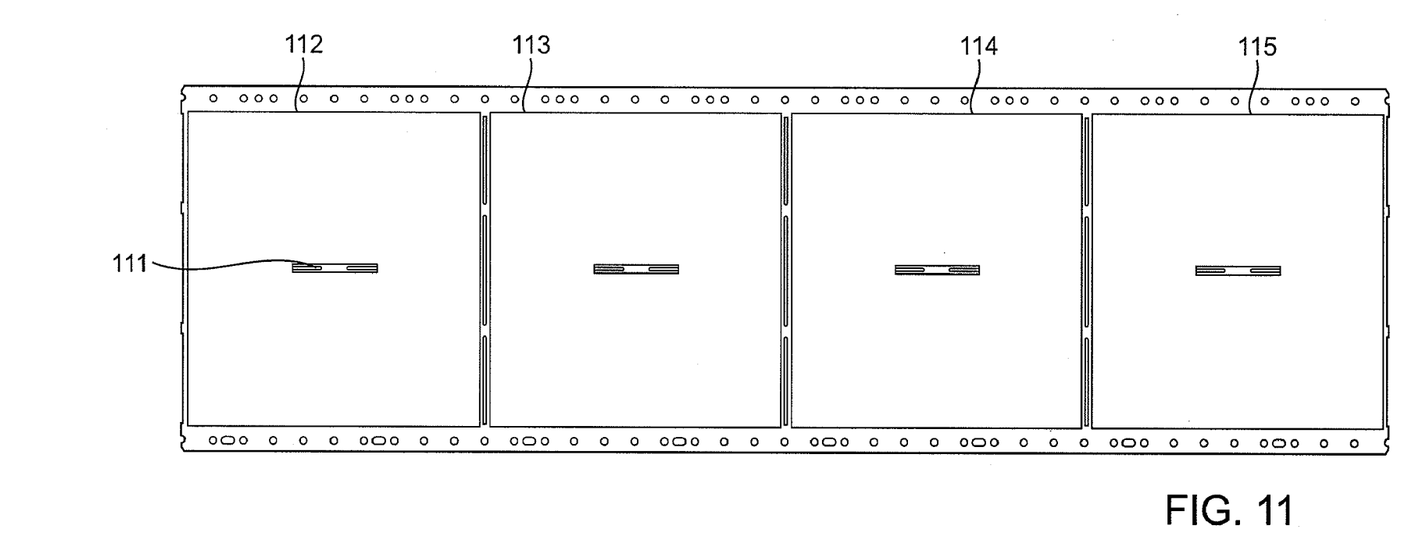
FIG. 11 is a top plan view of a mold layout.

FIG. 11 shows a mold layout. FIG. 11 shows various molded panels 112, 113, 114, 115, and a mold clamping area 111 between quadrants. The mold clamping area 111 is clamped during the molding process with molding dies on opposite sides of the clamping area. Molding material is then formed around the leadframe structures in the array, but does not cover the mold clamping area 111. As shown in FIG. 11, there can be many central mold clamping areas in an array of leadframe structures. Since clamping can occur at center regions of the leadframe array, this can prevent warping of the leadframe structures during molding.

The semiconductor die packages shown above can be formed using any suitable method. One embodiment of the invention comprises obtaining a leadframe structure comprising a die attach pad comprising a die attach surface comprising a folded edge structure and an opposite surface opposite to the die attach surface, and a plurality of leads extending laterally away from the die attach pad.

The leadframe structure may be obtained in any suitable manner. For example, the leadframe structure may be etched or stamped by using processes known to those of skill in the art.

After the leadframe structure is obtained, it is attached to a semiconductor die using solder or the like. Any suitable die attach material including solder may be used to attach the die to the die attach surface. The semiconductor die comprises a first surface and a second surface, and the first surface is attached to the die attach pad. The semiconductor dice for the packages may be obtained using processes known to those of ordinary skill in the art.

After the die is attached to the die attach pad, wire bonds (as shown in the previously described Figures) can be formed. Conventional wire bonding processes may be used to bond wires to the die and the leadframe structure.

A molding material is then formed around at least a portion of the leadframe structure and at least a portion of the semiconductor die. The opposite surface is exposed through the molding material and the terminal ends of the leads are substantially co-extensive with lateral surfaces of the molding material.

Figure 12:
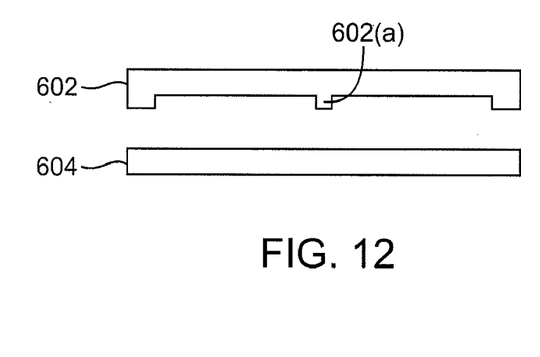
FIG. 12 is a side, cross-sectional view of a molding tool.

The molding process may be performed using a standard molding tool including molding dies. Suitable temperatures and pressures may be selected by those of ordinary skill in the art. As noted above in FIG. 11, however, in preferred embodiments, the center of a leadframe array may be clamped by the molding dies of a molding tool. Exemplary molding dies are schematically shown in FIG. 12. As shown in FIG. 12, a first molding die 602 can have a central protruding portion 602(a) which would be used to clamp down on the previously described clamping area 111. A second molding die 604 faces the first molding die 602, and the previously described leadframe structure array can be sandwiched between them. Molding material may be injected in between the first and second molding dies 602, 604, and the molding material may be solidified. Clamping the previously described clamping area 111 during molding decreases the chance of warping the leadframe structures in the array. It can also increase production capacity, since the molding process can process more semiconductor die packages as compared to situations where no clamping is performed at the center of the leadframe structure array.

After molding, the joined die packages may be singulated using a mechanical (e.g., sawing) or chemical (e.g., etching) singulation process. They may then be marked, tested and then mounted to a circuit board to form an electrical assembly.

The semiconductor die packages according to embodiments of the invention may be QFN-type packages and may be used in various electrical assemblies, and systems. They can be used in power supplies, computers, and any other suitable electronic devices.

Any one or more features of one or more embodiments may be combined with one or more features of any other embodiment without departing from the scope of the invention.

Any recitation of "a", "an" or "the" is intended to mean "one or more" unless specifically indicated to the contrary.

The above description is illustrative but not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

What is claimed is:

1. A semiconductor die package comprising:
   a leadframe structure comprising a die attach pad comprising a die attach surface, a folded edge structure disposed adjacent to the die attach surface, an opposite surface opposite to the die attach surface, and a plurality of leads extending laterally away from the die attach pad, the folded edge structure having a first major surface, a second major surface that is opposite and parallel to the first major surface, and a thickness between the first and second major surfaces, the first major surface having a first edge that abuts a portion of the die attach surface, a second edge that is parallel to the first edge, and an area disposed between the first and second edges and that rises above and extends laterally away from said first edge and the die attach surface;
   a semiconductor die comprising a first surface and a second surface, wherein the first surface is attached to the die attach surface of the die attach pad; and
   a molding material around at least a portion of the leadframe structure and at least a portion of the semiconductor die, and disposed on each of the first and second major surfaces of the folded edge structure, wherein the opposite surface of the leadframe structure is exposed through the molding material and terminal ends of the leads are substantially co-extensive with lateral surfaces of the molding material; and
   wherein the first edge of the first major surface is disposed closer to the semiconductor die than the second edge of the first major surface.

2. The semiconductor die package of claim 1 wherein the semiconductor die comprises a power MOSFET, and wherein the semiconductor die package is a QFN (quad flat no lead) package.

3. The semiconductor die package of claim 1 wherein the first surface comprises a first electrical terminal and the second surface comprises a second electrical terminal.

4. The semiconductor die package of claim 1 wherein the leads comprise drain leads integral with the die attach pad, and source and gate leads separated from the die attach pad.

5. The semiconductor die package of claim 4 wherein the second surface comprises source and gate regions, and wherein the die package further comprising bonding wires connecting source and gate regions to the source and gate leads, respectively.

6. The semiconductor die package of claim 1 wherein the leadframe structure comprises copper.

7. The semiconductor die package of claim 1 wherein the die attach pad comprises at least four folded edge structures surrounding the semiconductor die, and wherein the leads comprise leads that are integral to the die attach pad and at least one lead is between adjacent folded edge structures.

8. An electrical assembly comprising:
   the semiconductor die package of claim 1; and
   a circuit substrate, wherein the semiconductor die package is mounted on the circuit substrate.

9. The semiconductor die package of claim 1 wherein the folded edge structure forms an angle of about 45 to about 90 degrees with respect to the die attach pad.

10. The semiconductor die package of claim 1 wherein the folded edge structure forms an angle of about 60 to about 90 degrees with respect to the die attach pad.

11. The semiconductor die package of claim 10 wherein the semiconductor die comprises a vertical transistor.

12. The semiconductor die package of claim 1 wherein the molding material comprises an epoxy molding material.

13. The semiconductor die package of claim 1 wherein the folded edge structure is interleaved between two of the leads.

14. The semiconductor die package of claim 1 wherein the raised portion of the folded edge structure rises above the level of the first surface of the semiconductor die.

15. The semiconductor die package of claim 1 wherein the raised portion of the folded edge structure is disposed within the molding material.

16. The semiconductor die package of claim 1 wherein the raised portion of the folded edge structure has an end that terminates in the molding material.

17. The semiconductor die package of claim 1 wherein the second major surface of the folded edge structure has a length that is greater than the thickness between the first and second major surfaces, and has a width that is greater than said thickness.

* * * * *